(12) United States Patent
Shen

(10) Patent No.: US 6,327,302 B1
(45) Date of Patent: Dec. 4, 2001

(54) FAST ADAPTIVE EQUALIZER FOR WIRELESS COMMUNICATION SYSTEMS

(75) Inventor: Qun Shen, Cary, NC (US)

(73) Assignee: Ericsson Inc., Plano, TX (US)

( * ) Notice: Subject to any disclaimer, the term of this patent is extended or adjusted under 35 U.S.C. 154(b) by 0 days.

(21) Appl. No.: 09/143,161

(22) Filed: Aug. 28, 1998

(51) Int. Cl.$^7$ ..................................... H03H 7/30
(52) U.S. Cl. ............................ 375/232; 708/323; 333/18
(58) Field of Search .................... 375/232, 233, 375/229; 333/18; 708/323

(56) References Cited

U.S. PATENT DOCUMENTS

| | | | |
|---|---|---|---|
| 5,119,401 | * 6/1992 | Tsujimoto | 375/233 |
| 5,283,811 | * 2/1994 | Chennakeshu et al. | 375/233 |
| 5,517,527 | * 5/1996 | Yu | 375/233 |
| 5,524,125 | * 6/1996 | Tsujimoto | 375/233 |
| 5,546,430 | * 8/1996 | Liao et al. | 375/341 |
| 5,581,585 | * 12/1996 | Takatori et al. | 375/233 |
| 5,777,692 | * 7/1998 | Ghosh | 375/233 |
| 6,011,813 | * 1/2000 | Ghosh | 375/233 |

OTHER PUBLICATIONS

E.A. Lee and D.G. Messerschmitt, Digital Communication, $2^{nd}$ Edition, Kluwer Academic Publishers, 1994.
Application Book, Telecommunications Applications with TMS320C5x, DSPs, Texas Instruments, 1994.

J.G. Proakis, "Adaptive Equalization for TDMA Digital Mobile Radio," IEEE Trans. On Vehicular Technology, vol. 40, No. 2, May 1991.

P. Jung and P.W. Baiser, "VLSI Implementation of Soft Output Viterbi Equalizers for Mobile Radio Applications," Proc. Of Vehicular Technology Society $42^{nd}$ VTS Conference, pp. 577–585, 1992.

W.B. Mikhael et al, "Adaptive Filters with Individual Adaptation of Parameters," IEEE Trans. On Circuits and Systems, vol. CAS–33, No. 7, pp. 677–685, Jul. 1986.

V. Mathews and Z. Xie,"A Stochastic Gradient Filter with Gradient Adaptive Step Size," IEEE Trans. Signal Processing, vol. 41, No. 6, Jun. 1993.

* cited by examiner

Primary Examiner—Temesghen Ghebretinsae
(74) Attorney, Agent, or Firm—Ericsson Inc.

(57) ABSTRACT

A method and apparatus to accomplish fast adaptive equalization of a wireless communication channel is disclosed. The equalization method and apparatus utilize time varying adaptive filter coefficients and time varying convergence parameters in a fast adaptive algorithm to provide fast channel equalization in a wireless communication system.

10 Claims, 2 Drawing Sheets

FAST ADAPTIVE EQUALIZER FOR WIRELESS COMMUNICATION SYSTEMS

BACKGROUND OF THE INVENTION

Modern telecommunication has experienced explosive growth in the past decade. Distinguishing from the conventional telecommunication systems, there are two important aspects in modern telecommunication technologies, one being digital, and another being wireless. Wireless communication revolutionarily changes the way of communication and provides possibility of communication to anyone, from anywhere, at anytime. While wireless communication technology significantly changes the way people live and work, it adds tremendous challenges to communication engineering design. It is obvious that when a radio signal is transmitted through the air, the signal quality will largely depend on many variables in communication environments that are beyond our control. For example, the radio signal could be absorbed by or reflected from the buildings, mountains, or other obstacles between two points of communication. In addition, the received signal quality depends on the speed of mobile transmitter and receiver terminals. All of these increase the difficulties of maintaining a quality communication link. Furthermore, unlike a wired communication system, a wireless communication system often has problems with flat or frequency selective fading, and time dispersion.

In order to maintain a quality wireless communication signal, the radio channel must be estimated and properly compensated, and one effective means of such channel estimation and compensation is called channel equalization. Due to the time-varying nature of a radio channel, channel equalization is often designed to be adaptive, or time-varying, in order to track dynamic channel variation.

PRIOR ART

Various equalization techniques have been taught in prior arts for channel estimation and compensation and acoustic echo cancellation applications. Depending upon the application and the system requirements, an adaptive equalizer can be quite straightforward or rather complex in realization. A relatively simple equalization technique is perhaps a linear adaptive equalizer using the least mean square (LMS) algorithm. An LMS adaptive equalization minimizes an error signal, typically the mean square error between the output of an adaptive filter and the desired channel response through an adaptive process. A gradient descent adaptive algorithm is often utilized to minimize the mean square error. In a gradient descent adaptive algorithm, the gradient of the error signal with respect to filter coefficients is estimated and the filter coefficients are updated along the negative gradient direction at each iteration of the adaptive process until the mean square error is minimized. Because of its simplicity and easy implementation, LMS adaptive equalization, either linear or decision feedback, has been widely used in various applications.

Another equalization technique can be categorized as probabilistic detection algorithms. The most commonly used techniques within this category include Maximum A Posteriori probability (MAP) and Maximum Likelihood Sequence Estimation (MLSE). These techniques minimize the probability of a signal detection error and therefore require knowledge of channel characteristics and the stochastic property of channel noise. While the MAP technique detects a received signal in a symbol-by-symbol manner, the MLSE algorithm utilizes the Viterbi algorithm to minimize the probability of a sequence error. A more detailed description of equalization techniques based on probabilistic detection algorithms can be found in references such as Digital Communication ($2^{nd}$ ed. 1994) by E. A. Lee and D. G. Messerschmitt, Telecommunications Applications with TMS320C5x DSPs (Texas Instruments Application Book, 1994), and Adaptive Equalization for TDMA Digital Mobile Radio (IEEE Trans. On Vehicular Technology, Vol. 40, No. 2, May 1991) by J. G. Proakis.

The channel equalization techniques described above have both advantages and shortcomings. A simple linear adaptive equalizer is straightforward and simple to implement. However, it is less effective in severe wireless communication environments. Its limitation for wireless communication lies in the fact that the LMS algorithm is inherently a slow convergence algorithm, especially when the reference signal is highly correlated. Therefore, while the conventional LMS based equalization technique is attractive due to its simple implementation, its slow convergence property makes it difficult to track the rapid change of a radio channel due to the terminal speed and the dynamic operating environment.

In contrast to an LMS algorithm, a MAP or MLSE based equalization technique is quite effective in estimating and reducing inter-symbol interference (ISI). However, the complexity of implementing the MAP or MLSE algorithms is significantly higher than a LMS algorithm. In fact, the implementation complexity of the MAP and MLSE techniques prohibit its utility in certain applications. For example, in applications such as Personal Wireless Telecommunication (PWT) or Digital Enhanced Cordless Telecommunication (DECT), where time dispersion is typically not as severe as in cellular applications, a less complex equalization technique is often desirable because it has a lower cost.

SUMMARY OF THE INVENTION

The present invention relates to an adaptive equalizer design in a wireless communication system. More specifically, this invention describes a novel adaptive equalization method and apparatus that utilizes a fast adaptive algorithm. While the present invention is well suited for applications such as Personal Wireless Telecommunication, Digital Enhanced Cordless Telecommunication, Wireless Local Loop communication, and other cellular communication systems, it will be understood by one skilled in the art that the advantages of this invention will apply to other types of communication systems as well.

In light of the above mentioned problems associated with both least mean square algorithm and probabilistic detection algorithm equalization techniques in the prior art, it is an object of the present invention to provide an adaptive equalizer with less complexity than the commonly used MLS equalizer or MAP algorithm and a fast convergence property.

Another object of the present invention is to provide a fast adaptive algorithm that can be applied to both a linear equalizer and a decision feedback equalizer design.

A further object of the present invention is to provide a fast adaptive algorithm with a level of complexity and a structural simplicity that is close to the conventional Least Mean Square algorithm in order to also provide a channel equalization technique that has both a desirable level of accuracy and a low implementation cost.

Still another object of the invention is to utilize time-varying convergence parameters in the adaptive algorithm in order to achieve a fast convergence and to minimize the error signal.

These and other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION OF THE PREFERRED EMBODIMENTS

Figure 1:
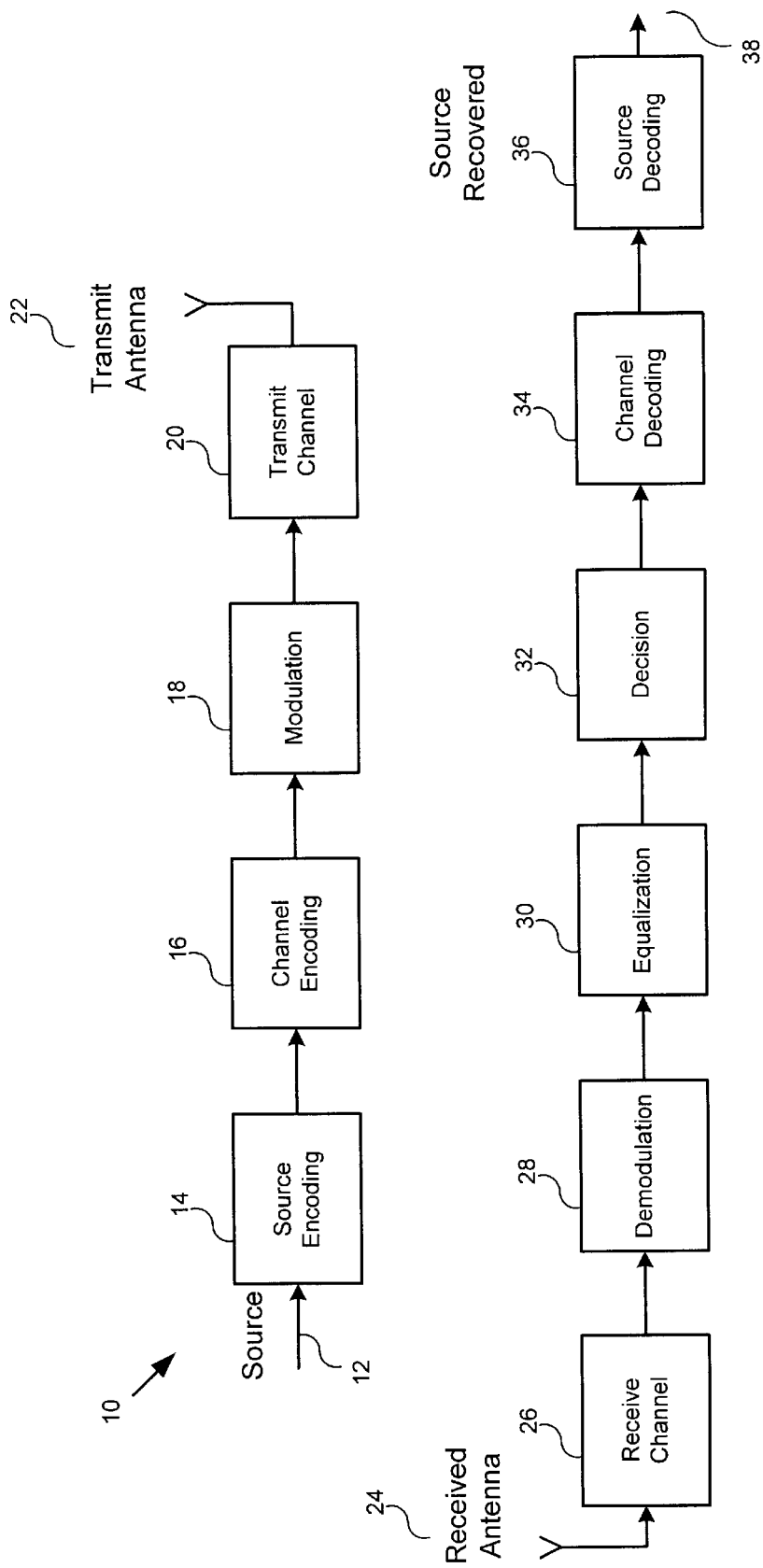
FIG. 1 is a block diagram of a prior art communication system with channel equalization.

FIG. 1 is a general illustration of a prior art wireless communication system 10. The current invention, a fast adaptive equalizer, may be used with the wireless communication system 10 as generally described below. Although the invention is described with respect to the preferred embodiment, those skilled in the art will recognize that other versions of the wireless communication system shown in FIG. 1 and of the equalizer shown in FIG. 2 embodying the current invention are possible and that the invention is not limited to a specific embodiment.

Although many constructions are possible and well known in the prior art, in the embodiment shown in FIG. 1, the wireless communication system 10 takes a source signal 12 and passes it through a source encoder 14, a channel encoder 16, and a modulator 18 before transmitting through a radio channel 20 and a transmit antenna 22. The transmitted signal is received through the antenna 24 of a receiver. At the receiver, the received channel 26 is passed through a demodulation unit 28, an equalizer 30, a decision device 32, a channel decoder 34 and a source decoder 36 before being output to a user as a recovered signal 38.

Figure 2:
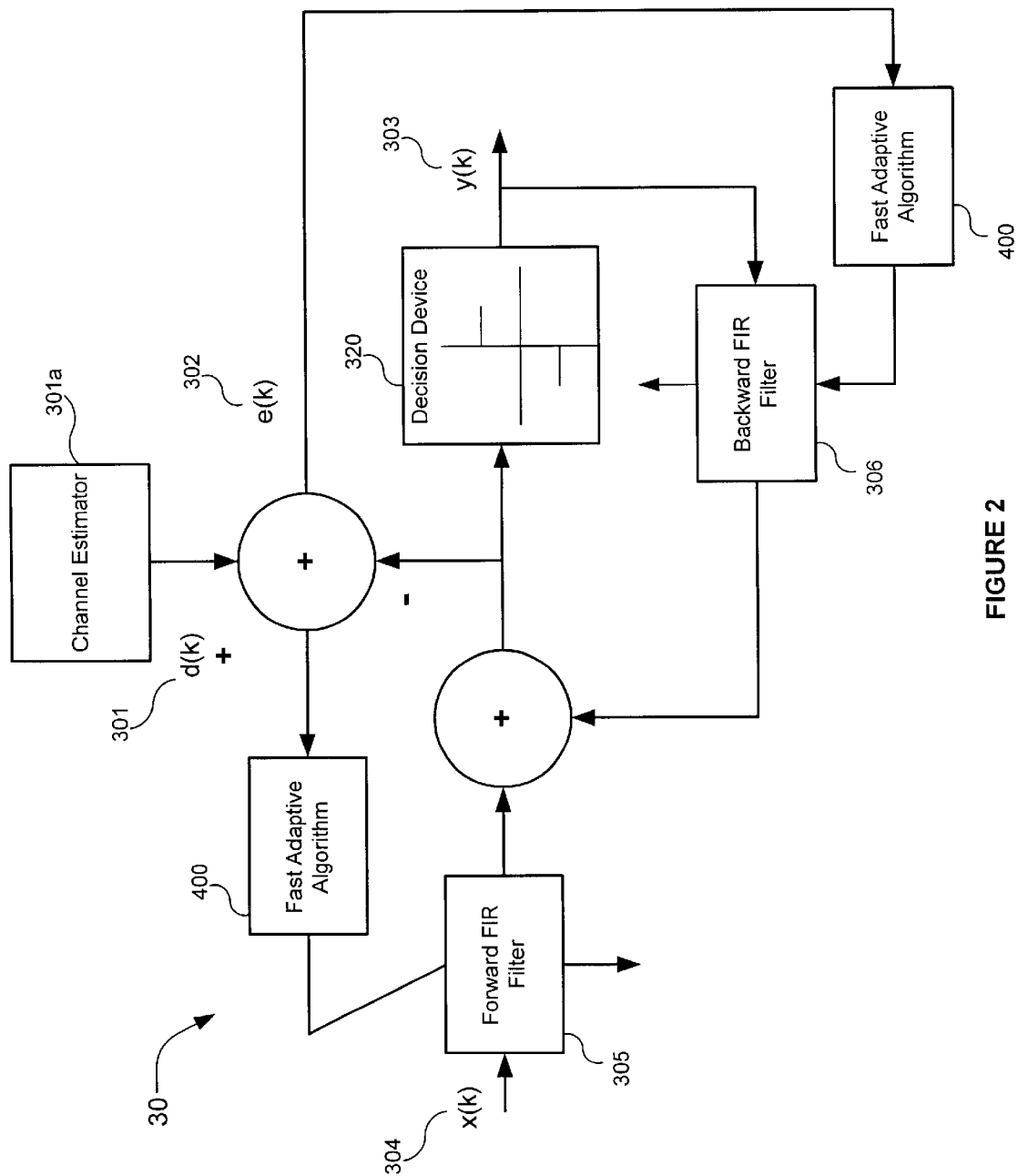
FIG. 2 is block diagram of an adaptive decision feedback equalizer.

There are two types of equalizers 30 that are well known in the prior art. The equalization technique illustrated in FIG. 2 is a decision feedback equalizer. More specifically, FIG. 2 illustrates a fast adaptive decision feedback equalizer 30 that is the subject of the present invention. The other equalization technique that could be used in the communication system illustrated in FIG. 1 is a linear equalizer. The linear adaptive equalizer is considered a special case of the decision feedback equalizer shown in FIG. 2 in which the backward filter is set to zero.

As shown in FIG. 2, in the fast adaptive decision feedback equalizer 30 of the present invention, x(k) is the input signal 304 received by the receiver, y(k) is the output signal 303 of the equalizer 30 at the k-th iteration of a signal sampling rate, respectively. The received signal x(k) is the input signal 304 to, and is used as the reference signal of, the forward filter 305, while the output signal y(k) 303 is fed back as the input signal for the backward filter 306. The desired signal d(k) 301 is obtained by channel estimation from channel estimator 301a in which an appropriate channel model is applied for system identification. The error signal e(k) 302 can be expressed as $$e(k) = d(k) - \sum_{i=0}^{I-1} w_{f,k}(i)x(k-i) - \sum_{j=1}^{J} w_{b,k}(j)y(k-j) \quad (1)$$

where $w_{f,k}$ and $w_{b,k}$ represent the equalizer coefficients of the forward filter 305 and the backward filter 306, respectively.

Furthermore, each iteration of the signal sampling rate is indicated in equation 1 through the use of k as the sample index, and I and J as the number of taps for the forward filter 305 and the backward filter 306, respectively. As further shown in FIG. 2, the fast adaptive algorithm 400 is designed to minimize the channel equalization error signal, e(k), 302 for the forward filter 305 and the backward filter 306 from one iteration to the next.

In order to minimize the error signal e(k) 302 in the shortest amount of time possible, it is well known in the prior art that the equalizer coefficients $w_{f,k}$ and $w_{b,k}$ should be updated at each iteration of the signal sampling rate. Typically, the gradient descent algorithm has been used to update the equalizer coefficients $w_{f,k}$ and $w_{b,k}$ according to the following equations, $$w_{f,k+1}(i) = w_{f,k}(i) + 2\mu x(k-i)e(k) \quad (2)$$

$$w_{b,k+1}(j) = w_{b,k}(j) + 2\mu y(k-j)e(k) \quad (3)$$

where i=0,1,2, ... I–1, j=1,2, ... J, and $\mu$ is the convergence parameter that determines the stability and convergence speed of the adaptive equalizer. Furthermore, in the prior art, the conventional technique of utilizing the gradient descent algorithm is to select a constant convergence parameter that is fixed for the entire adaptive process. The selection of step size is also usually a "trial and error" process that is slow and imprecise, as convergence often depends on the characteristics of an input signal.

Since fast tracking channel variation is important in wireless communication applications and the use of constant convergence parameters yields slower than desired results, the convergence property of the fast adaptive equalizer of the claimed invention is improved over the prior art by utilizing time-varying convergence parameters in the adaptive process. In the preferred embodiment of the present invention, the fast adaptive algorithm 400 is based on a LMS algorithm with gradient adaptive convergence parameters. The time-varying step sizes in the preferred fast adaptive decision feedback equalizer are designed to minimize the mean square of the error signal e(k) 302 for the forward filter 305 and the backward filter 306 from one iteration of the sampling rate to the next. This is preferably accomplished through dual adaptations. First, appropriate initial values of convergence parameters for the forward and backward filter coefficients are selected such that the adaptive process is stable and channel tracking is performed by updating the forward and backward filter coefficients of the adaptive decision feedback equalizer 30. The adaptive filter coefficients are preferably updated along the negative gradient direction at each iteration of a sampling rate of the input signal to minimize the error signal. Second, the convergence parameter is updated at each iteration to achieve a fast convergence and to minimize the error at each iteration, thereby also determining the convergence speed and stability of the adaptive process. Therefore, since the convergence parameters of the forward and backward coefficients of the fast adaptive decision feedback equalizer 30 are aimed at minimizing the mean square error at the next iteration, the convergence speed and tracking capability of the fast adaptive equalizer can be improved considerably in comparison to the conventional gradient decent decision feedback equalizer.

In one preferred embodiment, the variation of the convergence parameters is proportional to the negative gradient of the mean square error with respect to the previous convergence parameter. Therefore, in a decision feedback equalizer, the update equations for forward and backward coefficients can be expressed as $$w_{f,k+1}(i) = w_{f,k}(i) + 2\mu_f(k)x(k-i)e(k) \quad (4)$$

$$w_{b,k+1}(j) = w_{b,k}(j) + 2\mu_b(k)y(k-j)e(k) \quad (5)$$

where $\mu_f(k)$ and $\mu_b(k)$ are time-varying convergence parameters that are a function of a sampling rate iteration k for the forward filter 305 and the backward filter 306, respectively. Expressing equations (4) and (5) in a vector form yields, $$w_{f,k+1} = 2_{f,k} + 2\mu_f(k)e(k)x_k = w_{f,k} + \mu_f(k)\hat{\nabla}_{f,k} \quad (6)$$

$$w_{b,k+1} = w_{b,k} + 2\mu_b(k)e(k)y_k = w_{b,k} + \mu_b(k)\hat{\nabla}_{b,k} \quad (7)$$

where gradient estimates are given by (8) and (9)

$$\hat{\nabla}_{f,k} = \frac{\partial e^2(k)}{\partial w_{f,k}} = 2e(k)x_k \quad (8)$$

$$\hat{\nabla}_{b,k} = \frac{\partial e^2(k)}{\partial w_{b,k}} = 2e(k)y_k \quad (9)$$

and the input and output signal vectors are defined as $$x_k = [x(k)x(k-1)\ldots x(k-I+1)]^T \quad (10)$$

$$y_k = [y(k-1)y(k-2)\ldots y(k-J)]^T \quad (11)$$

Accordingly, in the preferred embodiment, the convergence parameters for the forward filter 305 and the backward filter 306 of the fast adaptive decision feedback equalizer 30 can be updated as follows:

$$\mu_f(k) = \mu_f(k-1) - \alpha \frac{\partial e^2(k)}{\partial \mu_f(k-1)} \quad (12)$$

$$= \mu_f(k-1) + \frac{\alpha}{2}\hat{\nabla}_{f,k}^T\hat{\nabla}_{f,k-1}$$

$$\mu_b(k) = \mu_b(k-1) - \beta \frac{\partial e^2(k)}{\partial \mu_b(k-1)} \quad (13)$$

$$= \mu_b(k-1) + \frac{\beta}{2}\hat{\nabla}_{b,k}^T\hat{\nabla}_{b,k-1}$$

where $\alpha$ and $\beta$ ($0 < \alpha, \beta \leq 1$) are scaling factors and can be properly selected to control the speed of adaptation for the convergence parameters. In practical applications, upper bounds for the scaling factors, and thereby for the convergence parameters, can be used to provide added stability to the equalizer 30. In addition, the convergence property of the fast adaptive equalizer 30 of the present invention may be further improved by assigning an individual convergence parameter to each filter tap. The step sizes for individual filter taps can be obtained by $$\mu_{f,k}(i) = \mu_{f,k-1}(i) + 2\alpha e(k)x(k-i)e(k-1)x(k-i-1) \quad (14)$$

$$\mu_{b,k}(i) = \mu_{b,k-1}(j) + 2\beta e(k)y(k-j-1)e(k-1)y(k-j-2) \quad (15)$$

whereby the update equations for the equalizer are then given by $$w_{f,k+1} = w_{f,k} + \underline{\mu}_{f,k}\hat{\nabla}_{f,k} \quad (16)$$

$$w_{b,k+1} = w_{b,k} + \underline{\mu}_{b,k}\hat{\nabla}_{b,k} \quad (17)$$

and $$\underline{\mu}_{f,k} = \text{diag}[\mu_{f,k}(1)\mu_{f,k}(2)\ldots\mu_{f,k}(i)\ldots\mu_{f,k}(I)] \quad (18)$$

$$\underline{\mu}_{b,k} = \text{diag}[\mu_{b,k}(1)\mu_{b,k}(2)\ldots\mu_{b,k}(j)\ldots\mu_{b,k}(J)] \quad (19)$$

are diagonal convergence parameter matrices whose components are given by (14) and (15).

In another embodiment of a fast adaptive algorithm 400, the convergence parameters can be obtained by taking the second derivative of the error signal and setting it to zero as in equation 20.

$$\frac{\partial e^2(k+1)}{\partial \mu_f(k)} = 0 \quad (20)$$

$$\frac{\partial e^2(k+1)}{\partial \mu_b(k)} = 0 \quad (21)$$

By expressing the error signal at the (k+1)-th sample as a function of the error at the k-th sample using Taylor's expansion, and omitting the higher order terms, the following relation holds $$e(k+1) = e(k) + \sum_{i=0}^{I-1}\frac{\partial e(k)}{\partial w_k(k)}\delta w_f(i) + \sum_{j=1}^{J-1}\frac{\partial e(k)}{\partial w_b(k)}\delta w_b(j) \quad (22)$$

Expressed in a vector form, $$e(k+1) = e(k) = \frac{\partial e_k}{\partial w_{f,k}}\delta w_{f,k} + \frac{\partial e_k}{\partial w_{b,k}}\delta w_{b,k} \quad (23)$$

$$= e(k) + \mu_f(k)x_k\hat{\nabla}_{f,k} + \mu_b(k)y_k\hat{\nabla}_{b,k}$$

Using the gradient estimates from (8), (9), (10), and (11), and taking the square of both sides of (23) yields, $$e(k+1)^2 = e^2(k)[1 - 2\mu_f(k)x_k^Tx_k 2\mu_b(k)y_k^Ty_k]^2 \quad (24)$$

From (20), (21), and (24), $$\mu_f(k)x_k^Tx_k + \mu_b(k)y_k^Ty_k = 0.5 = \text{constant} \quad (25)$$

The convergence parameters for the forward and backward equalizers can be generally obtained by $$\mu_f(k) = \frac{\alpha}{x_k^Tx_k} \quad (26)$$

$$\mu_b(k) = \frac{\beta}{y_k^Ty_k} \quad (27)$$

where $\alpha$ and $\beta$ are preferably positive constants with certain upper bounds to provide added stability to the equalizer 30.

Both preferred embodiments of the fast adaptive equalizers and algorithms described above improve the convergence behavior of the prior art decision feedback equalizer with variable step sizes. The current invention is considerably simpler in implementation than many non-LMS based equalizers but provides better convergence characteristics than conventional LMS based decision feedback equalizers. The current invention is therefore desirable for equalizer design in personal wireless telecommunications and other cellular applications where fast channel tracking is important. Although additional complexity is required in computing the time-varying convergence parameters, the complexity increment is small compared to other equalization techniques. Furthermore, these techniques can be applied to both channel estimation and channel tracking as well as both decision feedback and linear equalizer design.

In the foregoing specification, the invention has been described with reference to specific embodiments thereof. It will, however, be evident that various modifications and changes may be made thereto without departing from the broader spirit and scope of the invention as set forth in the appended claims. Those skilled in the art to which the invention pertains may make modifications and other embodiments employing the principles of this invention without departing from its spirit or essential characteristics, particularly after considering the foregoing teachings. The described embodiments are to be considered in all respects only as illustrative and not restrictive and the scope of the invention is, therefore, indicated by the appended claims rather than by the foregoing description.

I claim:

1. An adaptive channel equalization system to estimate and compensate for wireless communication channel distortion comprising:

an input signal receiver that receives the input signal;

a channel estimator that calculates a desired signal;

a decision device that calculates an output signal;

a forward filter that filters the input signal;

a backward filter that filters the output signal, the decision device calculating the output signal using the filtered input signal and the filtered output signal; and an adaptive algorithm responsive to the desired signal that minimizes an error signal that is sent to the forward and backward filters through the use of time varying adaptive filter coefficients and time varying convergence parameters wherein the variation of the convergence parameters as the convergence patterns are updated at each iteration of the adaptive algorithm is proportional to the negative gradient of the mean square error with respect to previous step sizes of the convergence parameters.

2. The adaptive channel equalization system of claim 1, wherein the adaptive filter coefficients are updated at each iteration of the adaptive algorithm.

3. The adaptive channel equalization system of claim 1, wherein the convergence parameters are updated at each iteration of the adaptive algorithm.

4. The adaptive channel equalization system of claim 3 wherein each updated convergence parameter minimizes the mean square error for the forward and backward filters from one iteration of the adaptive algorithm to each subsequent iteration.

5. The adaptive channel equalization system of claim 1, wherein the adaptive algorithm utilizes scaling factors to control the speed of adaptation.

6. A method of estimating and compensating for wireless communication channel distortion comprising:

sampling an input signal received from a transmitter;

obtaining a desired signal from a channel estimator;

calculating an error signal;

sending the input signal through a forward filter;

calculating an output signal;

sending the output signal through a backward filter; and utilizing an adaptive algorithm to minimize the error signal that is sent to the forward and backward filters through the use of time varying adaptive filter coefficients and time varying convergence parameters wherein the adaptive algorithm further comprises the step of maintaining the variation of the convergence parameters, as the convergence parameters are updated at each iteration of the adaptive algorithm, proportional to the negative gradient of the mean square error with respect to the previous step sizes of the convergence parameters.

7. The method of estimating and compensating for wireless communication channel distortion of claim 6, wherein the adaptive algorithm further comprises the step of updating the adaptive equalizer coefficients at each iteration of the adaptive algorithm.

8. The method of estimating and compensating for wireless communication channel distortion of claim 7, wherein the adaptive algorithm further comprises the step of updating the convergence parameters at each iteration of the adaptive algorithm.

9. The method of estimating and compensating for wireless communication channel distortion of claim 8 wherein the adaptive algorithm further comprises the step of using each updated convergence parameter to minimize the mean square error for the forward and backward filters from each iteration of the adaptive algorithm to each subsequent iteration.

10. The method of estimating and compensating for wireless communication channel distortion of claim 6, wherein the adaptive algorithm further comprises the step of utilizing scaling factors to control the speed of adaptation.

* * * * *